May 4, 1965 C. W. WANDREY 3,182,274

UHF TUNER WITH TURRET MOUNTED ROTOR ELEMENTS ADJUSTABLE WHEN ROTOR IS IN REGISTER WITH STATOR

Filed Oct. 1, 1962 2 Sheets-Sheet 1

INVENTOR.
Clarence W. Wandrey

BY

Cornelius J. O'Connor

Atty.

May 4, 1965 C. W. WANDREY 3,182,274

UHF TUNER WITH TURRET MOUNTED ROTOR ELEMENTS ADJUSTABLE WHEN ROTOR IS IN REGISTER WITH STATOR

Filed Oct. 1, 1962 2 Sheets-Sheet 2

INVENTOR
Clarence W. Wandrey
BY
Cornelius J. Donnor
Atty.

3,182,274

UHF TUNER WITH TURRET MOUNTED ROTOR ELEMENTS ADJUSTABLE WHEN ROTOR IS IN REGISTER WITH STATOR

Clarence W. Wandrey, Wheaton, Ill., assignor to Zenith Radio Corporation, Chicago, Ill., a corporation of Delaware Filed Oct. 1, 1962, Ser. No. 227,384
7 Claims. (Cl. 334—80)

This invention relates in general to frequency-determining variable reactance devices and in particular to a UHF tuner for a television receiver.

Initially, television broadcasting was relegated to twelve channels (channels 2–13) in portions of the VHF spectrum extending from approximately 54 megacycles to 216 megacycles. Subsequently, seventy additional channels (channels 14–83) were authorized in that portion of the UHF spectrum extending from 470 megacycles to 890 megacycles. However, the majority of television stations transmit on VHF channels and it has become common practice to provide television receivers with a step-by-step type of tuner, such as a turret or bandswitch, which has one operating position for each of the VHF channels but none for UHF channels.

For those areas serviced by UHF as well as, or instead of, VHF stations, the receiver is further provided with a continuously tunable UHF tuner capable of selecting any of the UHF channels since a seventy position step-type tuner is obviously impractical. Alternatively, and particularly in situations where pre-set frequency selection is desired or mandatory, the receiver is furnished with a turret tuner having replaceable tuning strips. Certain of the strips are adjustably tuned to VHF channels and, if UHF channels are available in the receiver location, others are adjustably tuned to the appropriate UHF channels. Such a VHF/UHF tuning arrangement has proved to be very popular because it lends to great customer convenience since, with it, remote control is easily attained for television channels in either the VHF or UHF band.

In an effort to relieve VHF spectrum crowding, as well as to stimulate growth of the television broadcasting industry, Congress recently enacted legistration empowering the Federal Communications Commission to require manufacturers to equip television receivers with a tuner capable of receiving all the UHF stations. Insofar as compliance with such a directive is concerned, no particular difficulties, short of economic, are foreseen since continuously tunable devices capable of accommodating all UHF channels are well known and available.

However, such prior art UHF tuners do not readily lend themselves to pre-set tuning in which the tuner may be selectively positioned to a discrete frequency in response, for example, to remote control. One principal shortcoming of such prior devices is the want of acceptable repeat accuracy. Repeat accuracy is best defined as the ability of the tuner, once it has been initially phased or set-up, to repeatedly condition the receiver for optimum reception at each operative position without recourse to retuning.

Of course, the turret type tuner has very acceptable repeat accuracy but an 82-position turret accommodating twelve VHF and seventy UHF channels is impractical. In order to use a turret having less positions and yet satisfying requirements for tuning in all of the UHF channels, it is necessary to arrange that at least one of the UHF strips be tunable over the entire band and that, too, is a formidable design specification.

It is therefore a general object of the invention to provide a novel frequency-determining variable reactance arrangement which is continuously tunable across the UHF band and which is also amenable to pre-set frequency selection.

It is a specific object of the invention to provide a tuner mechanism embodying a novel variable reactance arrangement for achieving discrete channel selection in any portion of the frequency spectrum over which the mechanism may tune.

It is also an object of the invention to provide an improved UHF tuner mechanism which lends itself to manual or remote control in the selection of any channel in the UHF band.

It is a further object of the invention to provide an improved turret-type UHF tuner mechanism which overcomes shortcomings of prior art UHF tuner arrangements.

An UHF turret tuner constructed in accordance with the invention comprises a housing, a carriage rotatably mounted within the housing and a plurality of frequency determining circuits tunable across the entire UHF band each including a reactance-contributing device having a fixed electrode. These fixed electrodes collectively define a stator assembly. The carriage supports a group of channel selectors each of which comprises a like plurality of adjustable electrodes constituting, when paired with assigned ones of the fixed electrodes, control elements for the reactance-contributing devices. The adjustable electrodes collectively define a control assembly. Means are coupled to the carriage for sequentially advancing the channel selectors from an electrically inactive storage position to an operative position in registration with the stator assembly. Finally, means are provided for tuning the frequency determining circuits which means comprise a driver engageable with the control assembly of the one of said channel selectors instantaneously in registration with the stator assembly for displacing the adjustable electrodes relative to their assigned fixed electrodes.

Additionally, the invention contemplates a UHF tuner for a television receiver having a discrete channel selector circuit comprising an inductor and a capacitor version of the adjustable reactance contributing device.

The features of this invention which are believed to be novel are set forth with particularity in the appended claims. The invention, together with further objects and advantages thereof, may best be understood, however, by reference to the following description taken in conjunction with the accompanying drawings, in the several figures of which like reference numerals identify like elements, and in which:

Figure 1:
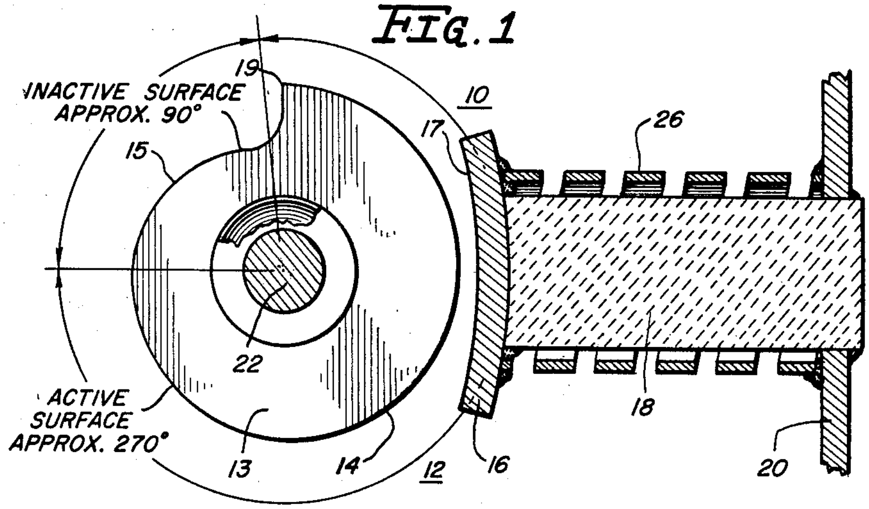
FIGURE 1 is a sectional view, taken along lines 1—1 of FIGURE 2, of a variable reactance device exemplifying the invention.

Referring now more particularly to FIGURE 1, the frequency-determining circuit 10 there shown comprises an adjustable reactance contributing device 12, specifically a capacitor, which is continuously adjustable to tune the circuit over a predetermined band of frequencies. The capacitor comprises a first member or electrode 13 having an active peripheral surface 14 having a radial dimension which changes continuously from the apex 19 of electrode 13, as viewed in FIGURE 1, to a point approximately 270 degrees in a clockwise direction therefrom. The remaining peripheral surface 15 of electrode 13 is contiguous to active surface 14 and constitutes an inactive area having a maximum radius which does not exceed the minimum radius of active surface 14.

Capacitor 12 further includes a second electrode member 16 having an active surface 17. Electrode 16 is supported by a post 18 of insulating material, e.g. steatite, which is anchored to a plane of reference potential. As will be shown, this plane may constitute the wall 20 of a tuner housing. Supported in this fashion, the active surface 17 of electrode 16 is disposed in a facing or confronting relation to active surface 14 of electrode 13 so as to determine therewith a variable capacitive reactance, the magnitude of which changes primarily with variations in the spacing of active electrode surfaces 14 and 17. Surface 17 is of arcuate configuration and, in addition to being physically smaller than surface 14, has a substantially constant radius of curvature. Thus, for all practical purposes, the active surfaces of electrodes 13 and 16 are disposed in eccentric relation so that rotation of either electrode with respect to the other, even about a common axis, effects a change in the spacing between their active surfaces.

While relative rotation of electrodes 13, 16 may be accomplished in any desired fashion, preferably electrode 16 is fixed, as shown, and electrode 13 is secured upon a tuning shaft 22. Shaft 22 thus constitutes means for effecting relative rotation between electrodes 13 and 16 in order to change the spacing between their respective active surfaces.

Frequency determining circuit 10 further includes an inductor 26 having a plurality of turns and tunable by capacitor 12. One end of inductor 26 is conductively connected to electrode 16 while the opposite end is connected to wall 20.

The frequency determining circuit 10 of FIGURE 1, in addition to being tunable across a predetermined band of frequencies, is, by virtue of the novel construction of tuning capacitor 12, particularly amenable to pre-set frequency selection. Circuit 10 therefore finds specific application in a UHF tuner for a television receiver. The particulars of the television receiver itself are not dwelt upon here. Reference is made to copending application Serial No. 227,376, filed concurrently herewith in the names of George R. Dickinson and Eugene J. Polley, which not only describes such a receiver but also details the operative relationship between a UHF tuner and the television receiver proper.

Figure 2:
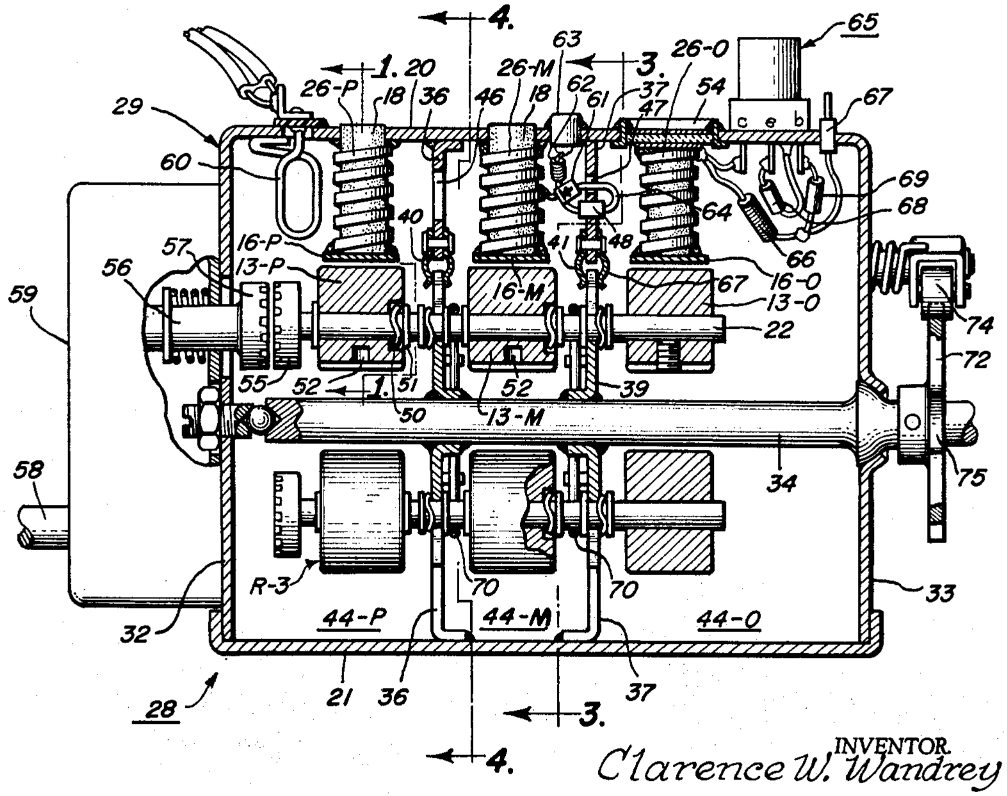
FIGURE 2 is a sectional view, partly broken away, of a UHF television tuner for which the present invention is especially suited.
Figures 3, 4, 5:
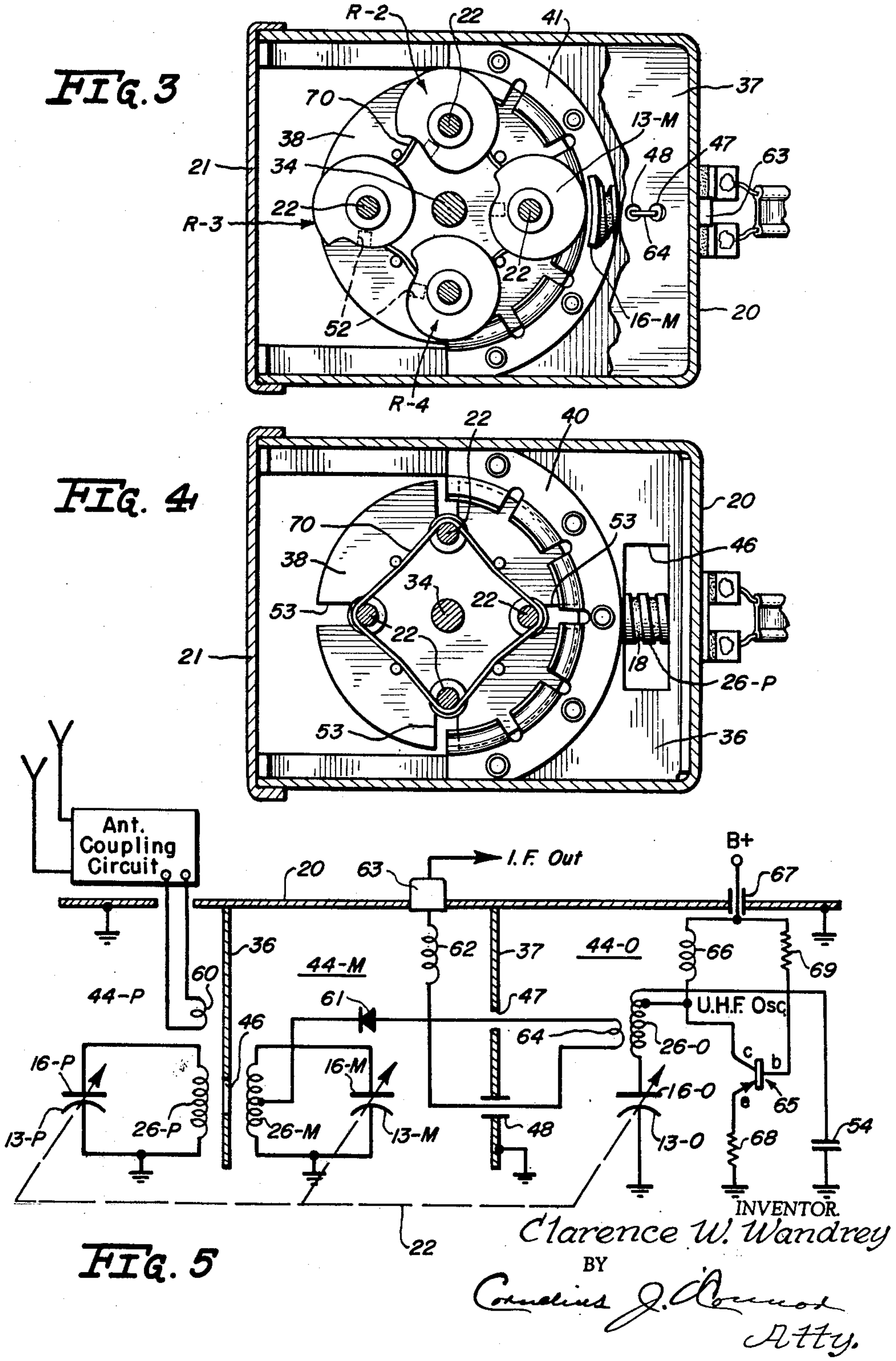
FIGURE 3 is a sectional view of the tuner of FIGURE 2 taken along lines 3—3.
FIGURE 4 is a sectional view of the tuner of FIGURE 2 taken along lines 4—4.
FIGURE 5 is a schematic diagram of the tuner shown in FIGURE 2.

Accordingly, and in a specific application of the invention, circuit 10 is incorporated in a turret-type UHF tuner 28 having a plurality of operating positions in each of which the associated television receiver is conditioned for operation at a discrete channel in the UHF band. To this end, and as best seen in FIGURES 2–4, tuner 28 comprises a housing 29 having a pair of sidewalls 20, 21 and a pair of endwalls 32, 33 which rotatably support a selector shaft 34. As shown in the copending Dickinson et al. application, shaft 34 may be manually or electrically driven to select a desired operating position of tuner 28. Secured to sidewalls 20, 21 and extending therebetween are partitions 36, 37. Spaced along shaft 34 and affixed thereto adjacent partitions 36, 37 are a pair of discs 38, 39. Secured to partitions 36, 37 and resiliently bearing on discs 38, 39, respectively, are pairs of multiple-fingered grounding leaves 40, 41. Partitions 36, 37 together with discs 38, 39 divide the tuner housing into three chambers or compartments constituting preselector, mixer and oscillator stages 44–P, 44–M and 44–O, respectively. Partition 36 includes a coupling window 46, see FIGURE 4, while, as best seen in FIGURE 3, partition 37 is provided with a coupling slot 47 and a feed-through capacitor 48.

Each of the three stages includes a form of the tunable circuit 10, comprising inductor 26 and an adjustable capacitor 12, shown in FIGURE 1. Where appropriate, the components of circuit 10 are suffixed by a P, M or O to identify the particular stage, i.e., preselector, mixer or oscillator, with which the component is associated. To this end and as best seen in FIGURE 2 preselector compartment 44–P is provided with an inductor 26–P, one end of which is conductively connected to wall 20 while the opposite end is connected to capacitor electrode 16–P. Electrode 13–P constitutes the adjustable capacitor electrode associated with stationary electrode 16–P and is releasably secured upon tuning shaft 22 by a spring washer 50 and a clip 51. In order to allow tracking adjustment, electrode 13–P is drilled out, as indicated at 52, to accommodate a tuning wand thereby permitting, if necessary, a desired angular orientation of electrode 13–P upon shaft 22 in relation to another electrode. Insofar as tracking adjustments are concerned, it is also appreciated that the active surface of electrode 13–P can be slotted or relieved in such a fashion as to permit the electrode to be "knifed" in the manner conventionally practiced with capacitive type tuning elements. Shaft 22 is rotatably journalled within an aligned pair of slots 53, see FIGURE 4, in discs 38, 39 and retained therein by a wire spring 70. Since the active surface of electrode 13–P presented to electrode 16–P is developed by a continuously changing radius, rotating the former between the limits bounded by its active surface serves to vary the air gap between the two electrodes to tune inductance 26–P across the entire UHF band.

The manner in which the radius changes determines the tuning characteristic, that is to say the effective capacitance of the adjustable condenser is a function of the instantaneous position of the movable electrode. Preferably, the change in capacitance with rotation of the movable electrode is approximately linear, in other words, equal increments of rotation of electrode 13–P between the aforementioned limits give rise to equal changes in capacitance. While this ideal is not practically attainable, it is best approached by developing the profile of the active surface of electrode 13–P so that it approximates a section of an Archimedean spiral.

In like fashion mixer and oscillator stages 44–M and 44–O are provided with respective inductors 26–M, 26–O which, in turn, are terminated by arcuate capacitor electrodes 16–M, 16–O. While inductor 26–M is also conductively connected to wall 20, inductor 26–O is coupled to that reference plane via a disc type capacitor 54. Adjustable capacitor electrodes 13–M, 13–O, are substantially identical in form to electrode 13–P and are similarly mounted on shaft 22 to confront fixed plates 16–M, 16–O, respectively, in a capacitive relation. As in the case of electrode 13–P, electrode 13–M is also frictionally secured upon shaft 22 and provided with a hole 52 for receiving a tracking wand. Electrode 13–O, on the other hand, is adjustably secured upon tuning shaft 22 by a conventional set screw. One end of tuning shaft 22 is terminated with a crown 55 disposed in axial alignment with a spring-biased adjusting tool 56 having a driving head 57 complementary in form to crown 55 and mechanically coupled to a manual tuning control 58. Control 58 is normally disengaged from tuning shaft 22 but can be coupled thereto via a push or pull-to-actuate clutch and a transmission 59 including a step-down gear train of conventional construction so that tuning adjustments are not overly critical. Control 58 permits manual tuning of circuit 10 over the entire UHF band as described more particularly hereinafter.

Electrically, inductor 26–P and capacitor 13–P, 16–P comprise the first section of a double-tuned RF input circuit while inductor 26–M and capacitor 13–M, 16–M constitute the second section thereof, see FIGURE 5. Inductor 26–O and capacitor 13–O, 16–O constitute a frequency-determining circuit for the local oscillator used in UHF reception. In addition to an inductor and a variable capacitor preselector, tuner stage 44–P has an input coupling coil 60 while mixer compartment 44–M includes a mixer crystal 61 connected between inductor 26–M and one terminal of feed-through capacitor 48. An IF coil 62 is coupled between the other terminal of feed-through capacitor 48 and an output jack 63.

Oscillator chamber 44–O is coupled to mixer crystal 61 by virtue of the lead portion 64 of the mixer crystal which protrudes through coupling slot 47. The oscillator stage further includes a transistor device 65 the collector of which is coupled to the junction of inductor 26–O and capacitor 54 and to a source of unidirectional potential B+ through a choke coil 66 and a feed-through capacitor 67. The emitter is returned to a reference plane (housing wall 20) through a resistive impedance 68. The base electrode, in turn, is connected to the unidirectional source via a resistor 69. Electrically, this is a common form of a tuned collector transistor oscillator.

As thus far described UHF tuner 28 comprises preselector, mixer and oscillator compartments each having a capacitive rotor and stator assembly and collectively effective to tune across the UHF band. In order to permit preset tuning to more than one discrete frequency in the UHF band, three additional rotor assemblies R–2, R–3 and R–4 are provided each identical to the assembly shown in registration with stator electrodes 16–P, 16–M and 16–O in FIGURE 2. The additional rotor assemblies, as indicated in FIGURE 4, are journalled in assigned ones of slots 53 in discs 38, 39 and retained within their respective slots by wire spring 70.

A detent mechanism for insuring proper spatial registration between the rotatable capacitor electrodes and the stationary electrodes of tuner 28 comprises a panel 72 affixed to shaft 34 and having a series of equally spaced peripheral notches or detents 73 corresponding to the four turret positions. The detent mechanism includes a roller 74, see FIGURE 2, positioned for cooperative engagement with the detents of panel 72.

It is appreciated, of course, that in order to accommodate the UHF stations available in any particular locale, the disclosed UHF turret mechanism can be altered to accept any desired number of rotor assemblies. Moreover, since each series of rotors together with the common stator assembly is capable of tuning across the UHF band by manipulation of tuning control 58, any or all may be pretuned to select an assigned UHF channel. By the same token any of the assemblies can be utilized as a continuous UHF tuner in compliance with the aforementioned proposed legislation.

Prior to operation each of the UHF rotor assemblies is pre-set to select an assigned UHF channel. To accomplish this each rotor assembly, in turn, is brought into registration with the stator electrode assembly by manipulation of channel selector shaft 34. Tuning control 58 is actuated to effect a driving engagement between tool 56 and the crowned termination of rotor shaft 22 and then rotated until the desired channel has been tuned at which time control 58 is released. If necessary, tracking adjustments are performed on electrodes 13–P, 13–M. When the pre-set operations have been completed, discrete UHF channels may be received simply by rotating shaft 34 to bring the selected series of electrode rotors into registration with the stator electrode assembly.

For purposes of illustration, assume that the series of electrode rotors 13–P, 13–M and 13–O shown in registration with respective stator electrodes 16–P, 16–M and 16–O in FIGURE 2 is pre-set to UHF channel "A." The signal broadcast on UHF channel A is selected by the double-tuned preselector 26–P, 13–P, 16–P and 26–M, 13–M, 16–M and applied to mixer crystal 61. Concurrently, the heterodyne oscillator, including tuned circuit 26–O, 13–O, 16–O, applies a heterodyning signal via loop 64 to mixer crystal 61. Conventional mixer action then develops an IF signal which is selected by a tuned output circuit including inductor 62. This IF signal is coupled from output jack 63 to an amplifier which, as shown in the Dickinson et al. application, can be the VHF tuner. The amplified signal is then coupled to the IF amplifier of the television receiver proper.

In summary, there is disclosed a novel tuning capacitor construction which makes possible an improved turret-type UHF tuner. By virtue of its ability to repeatedly select a pre-set frequency, a UHF tuner employing this novel capacitor arrangement finds particular utility in remotely controlled tuning systems.

While a particular embodiment of the present invention has been shown and described, it is apparent that changes and modifications may be made therein without departing from the invention in its broader aspects. The aim of the appended claims, therefore, is to cover all such changes and modifications as fall within the true spirit and scope of the invention.

I claim:

1. A UHF turret tuner for television comprising:
a housing;
a carriage rotatably mounted within said housing;
a plurality of frequency determining circuits tunable across the entire UHF television band and each including a reactance-contributing device having a fixed electrode, said fixed electrodes collectively defining a stator assembly;
a group of channel selectors supported upon said carriage and each comprising a like plurality of adjustable electrodes constituting, when paired with assigned ones of said fixed electrodes, control elements for said reactance-contributing devices, said adjustable electrodes collectively defining a control assembly;
means coupled to said carriage for sequentially advancing said channel selectors from an electrically inactive storage position to an operative position in registration with said stator assembly;
and means for tuning said frequency determining circuits comprising a driver engageable with the control assembly of the one of said channel selectors instantaneously in registration with said stator assembly for displacing said adjustable electrodes relative to their said assigned fixed electrodes.

2. A UHF turret tuner for television comprising:
a housing;
a carriage rotatably mounted within said housing;
a plurality of frequency determining circuits tunable across the entire UHF television band and each including a reactance-contributing device having a fixed electrode, said fixed electrodes collectively defining a stator assembly;
a group of channel selectors rotatably supported upon said carriage and each comprising a like plurality of rotatable electrodes constituting, when paired with assigned ones of said fixed electrodes, control elements for said reactance-contributing devices, said rotatable electrodes collectively defining a rotor assembly;
means coupled to said carriage for sequentially advancing said channel selectors from an electrically inactive storage position to an operative position in registration with said stator assembly;
and means for tuning said frequency determining circuits comprising a rotatable driver engageable with the rotor assembly of the one of said channel selectors instantaneously in registration with said stator assembly for changing the spacing of said rotatable electrodes relative to their said assigned fixed electrodes.

3. A UHF turret tuner for television comprising:
a housing;
a carriage rotatably mounted within said housing;
a plurality of frequency determining circuits tunable across the entire UHF television band and each including a reactance-contributing device comprising a fixed electrode having a surface of constant curvature, said fixed electrodes collectively defining a stator assembly;

a group of channel selectors supported upon said carriage and each comprising a like plurality of adjustable eletrodes, each of said adjustable electrodes having a surface the radius of curvature of which changes continuously from a maximum to a minimum and constituting, when paired with an assigned one of said fixed electrodes, a control element for the reactance-contributing device associated therewith, said adjustable electrodes collectively defining a control assembly;

means coupled to said carriage for advancing said channel selectors from an electrically inactive storage position to an operative position in registration with said stator assembly;

and means for tuning said frequency determining circuits comprising a driver engageable with the control assembly of the one of said channel selectors instantaneously in registration with said stator assembly for displacing each of said adjustable electrodes relative to their said assigned fixed electrodes to change the spacings therebetween.

4. A UHF turret tuner for television comprising:

a housing;

a carriage rotatably mounted within said housing;

a plurality of frequency determining circuits tunable across the entire UHF television band and each including a capacitor comprising a fixed electrode, said fixed electrodes collectively defining a stator assembly;

a group of channel selectors rotatably supported upon said carriage and each comprising a like plurality of rotatable electrodes constituting, when paired with assigned ones of said fixed electrodes, control elements for said capacitors, said rotatable electrodes collectively defining a rotor assembly;

means coupled to said carriage for sequentially advancing said channel selectors from an electrically inactive storage position to an operative position in registration with said stator assembly;

and means for tuning said frequency determining circuits comprising a driver engageable with the rotor assembly of the one of said channel selectors instantaneously in registration with said stator assembly for changing the spacing of each of said rotatable electrodes relative to its said assigned fixed electrode.

5. A UHF turret tuner for television comprising:

a housing;

a carriage rotatably mounted within said housing;

a plurality of frequency determining circuits tunable across the entire UHF television band and each including an inductor and a capacitor comprising a fixed electrode, said fixed electrodes collectively defining a stator assembly;

a group of channel selectors supported upon said carriage and each comprising a like plurality of rotatable electrodes constituting, when paired with assigned ones of said fixed electrodes, control elements for said capacitors, said rotatable electrodes collectively defining a rotor assembly;

means coupled to said carriage for sequentially advancing said channel selectors from an electrically inactive storage position to an operative position in registration with said stator assembly;

means for tuning said frequency determining circuits comprising a driver engageable with the rotor assembly of the one of said channel selectors instantaneously in registration with said stator assembly for changing the spacing of each of said rotatable electrodes relative to their said assigned fixed electrodes;

and means for releasably securing said rotatable electrodes in a pre-set position to maintain a selected spacing between said paired electrodes and establish said channel selectors as discrete UHF station selectors.

6. A UHF turret tuner for television comprising:

a housing;

a carriage rotatably mounted within said housing;

a plurality of frequency determining circuits tunable across the entire UHF television band and each including a capacitor comprising a fixed electrode having a surface of constant curvature, said electrodes collectively defining a stator assembly;

a group of channel selectors supported upon said carriage and each comprising a like plurality of rotatable electrodes, each of said rotatable electrodes having a curved surface the profile of which approximates a section of an Archimedean spiral and constituting, when paired with an assigned one of said fixed electrodes, a control element for capacitor associated therewith, said rotatable electrodes collectively defining a rotor assembly;

means coupled to said carriage for advancing said channel selectors from an electrically inactive storage position to an operative position in registration with said stator assembly;

and means for tuning said frequency determining circuits comprising a driver engageable with the rotor assembly of the one of said channel selectors instantaneously in registration with said stator assembly for changing the spacing of said rotatable electrodes relative to their said assigned fixed electrodes.

7. A UHF turret tuner for television comprising:

a housing;

a carriage rotatably mounted within said housing;

a preselector stage;

a mixer stage;

an oscillator stage;

each said stage having a frequency determining circuit tunable across the entire UHF television band and including a capacitor comprising a fixed electrode, said fixed electrodes collectively defining a stator assembly;

a group of channel selectors rotatably supported upon said carriage and each comprising a rotatable electrode for each said stage, said rotatable electrode constituting, when paired with an assigned one of said fixed electrodes, a control element for the capacitor associated therewith, said rotatable electrodes collectively defining a rotor assembly;

means coupled to said carriage for advancing said channel selectors from an electrically inactive storage position to an operative position in registration with said stator assembly;

and means for tuning said frequency determining circuits comprising a rotatable driver engageable with the rotor assembly of the one of said channel selectors instantaneously in registration with said stator assembly for changing the spacing of each of said rotatable electrodes relative to its said assigned fixed electrode.

References Cited by the Examiner

UNITED STATES PATENTS

| | | | |
|---|---|---|---|
| 2,170,261 | 8/39 | Dunn | 334—84 |
| 2,488,545 | 11/49 | Lader | 317—249 X |
| 2,773,986 | 12/56 | Thias et al. | 334—50 |

FOREIGN PATENTS

| | | |
|---|---|---|
| 662,675 | 12/51 | Great Britain. |

HERMAN KARL SAALBACH, *Primary Examiner.*